United States Patent [19]

Tanaka et al.

[11] Patent Number: 5,024,101
[45] Date of Patent: Jun. 18, 1991

[54] POWER SOURCE CIRCUIT AND BRIDGE TYPE MEASURING DEVICE WITH OUTPUT COMPENSATING CIRCUIT UTILIZING THE SAME

[75] Inventors: Hiroaki Tanaka, Okazaki; Takeshi Enya, Nishio; Katsumi Nakamura, Okazaki, all of Japan

[73] Assignees: Nippondenso Co., Ltd., Kariya; Nippon Soken, Inc., Nishio, both of Japan

[21] Appl. No.: 478,097

[22] Filed: Feb. 9, 1990

[30] Foreign Application Priority Data

Feb. 10, 1989 [JP] Japan .................................. 1-31728

[51] Int. Cl.$^5$ .............................................. G01B 7/16
[52] U.S. Cl. ..................................................... 73/766
[58] Field of Search ......................... 73/766, 765, 708; 323/365, 367

[56] References Cited

U.S. PATENT DOCUMENTS 4,715,003  12/1987  Keller et al. ..................... 73/766 X

FOREIGN PATENT DOCUMENTS

| 52-40184   | 3/1977  | Japan . |
| 52-42167   | 4/1977  | Japan . |
| 53-703     | 1/1978  | Japan . |
| 58-41309   | 3/1983  | Japan . |
| 59-51303   | 3/1984  | Japan . |
| 59-184819  | 10/1984 | Japan . |
| 60-46641   | 10/1985 | Japan . |
| 62-95010   | 5/1987  | Japan . |
| 62-168030  | 7/1987  | Japan . |
| 62-185137  | 8/1987  | Japan . |
| 62-55629   | 11/1987 | Japan . |
| 62-187131  | 8/1988  | Japan . |

OTHER PUBLICATIONS

Charles A. Holt, Electronic Circuits Digital and Analog, pp. 438-441.
Graeme et al., Operational Amplifiers Design and Applications, pp. 426-431.
Millman et al., Microelectronics Digital and Analog Circuits and Systems, pp. 524-525.

Primary Examiner—Jerry W. Myracle
Attorney, Agent, or Firm—Cushman, Darby & Cushman

[57] ABSTRACT

Provided is a constant voltage source for providing a reference constant voltage at a predetermined temperature, the temperature characteristics of an output of the constant voltage source being adjustable, and also provided is a bridge type measuring device comprising, a bridge circuit consisting of a plurality of detecting devices, at least one of resistance values thereof being varied in response to a variation in conditions of an object to be measured. An output compensating circuit for a bridge type measuring device can also be obtained by which the temperature characteristics of an output of the device may be adjusted utilizing the reference constant voltage of the constant voltage source which may be formed which comprises a memory storing a digital value and a digital-to-analog converter.

8 Claims, 4 Drawing Sheets 1,2,3,4—DETECTING ELEMENTS FORMING BRIDGE TYPE MEASURING DEVICE
13——POWER SOURCE CIRCUIT
200——VOLTAGE-TO-CURRENT CONVERTING CIRCUIT
12—— SECOND RESISTOR
100—CONSTANT CURRENT CIRCUIT AS CONSTANT CURRENT SOURCE

130 --- VOLTAGE SOURCE
500 --- AMPLIFYING CIRCUIT
600 --- OUTPUT CIRCUIT

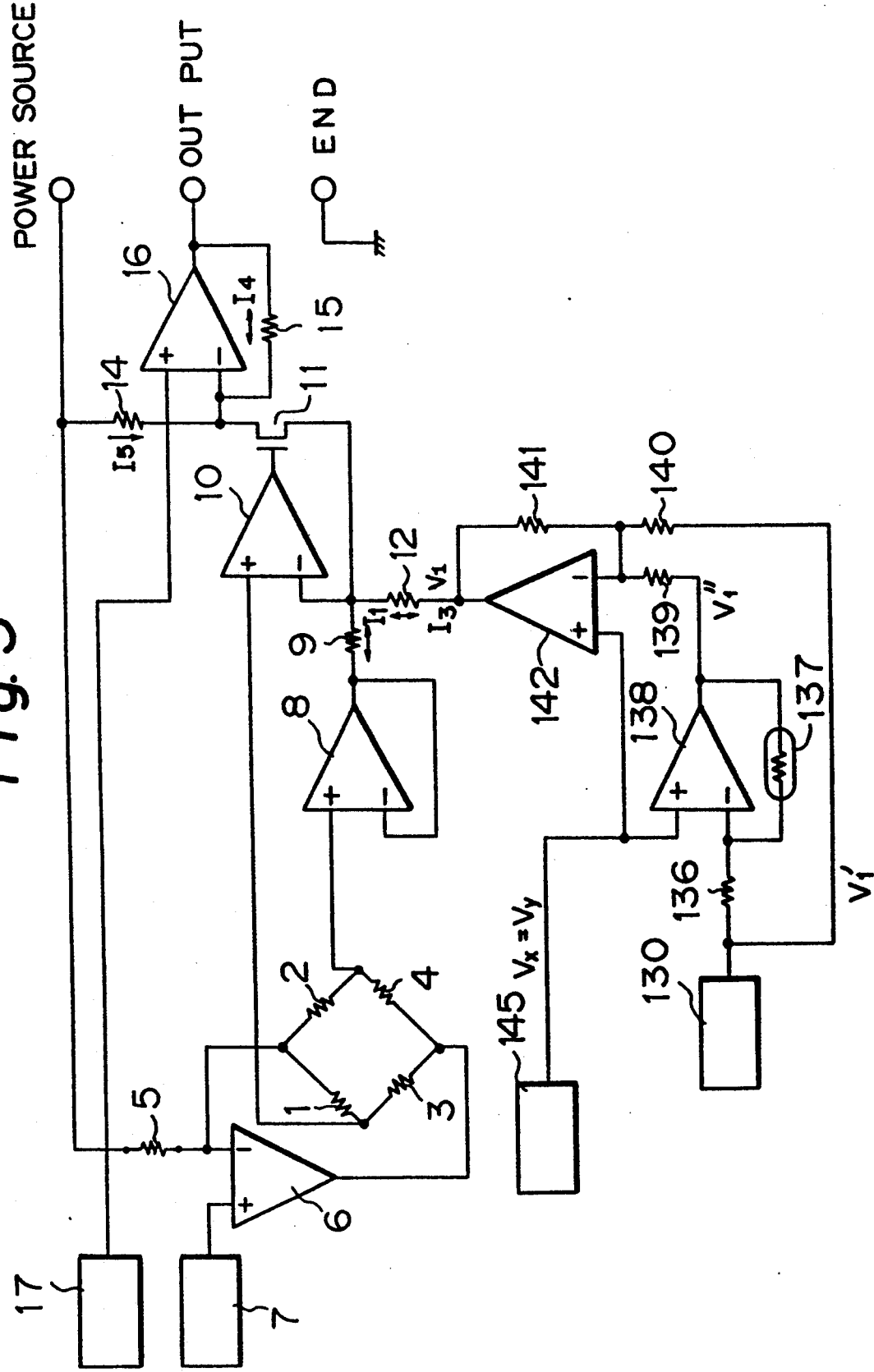

POWER SOURCE CIRCUIT AND BRIDGE TYPE MEASURING DEVICE WITH OUTPUT COMPENSATING CIRCUIT UTILIZING THE SAME

BACKGROUND OF THE INVENTION

1. Field of the Invention

The present invention relates to a power source circuit for providing an output voltage with adjustable temperature characteristics, and a bridge type measuring device with an output compensating circuit utilizing the power source circuit to compensate the temperature characteristics of the bridge type measuring device.

2. Description of the Related Art

A conventional output compensating circuit for a bridge type measuring device is disclosed, for example, in Japanese Unexamined Patent Publication (Kokai) No. 55-155253, which employs adjustable resistors whose resistance values are adjustable to adjust the output gradient and temperature characteristics of the bridge type measuring device.

When the adjustable resistors of the output compensating circuit of the above disclosure are adjusted to compensate the temperature characteristics, a current flowing through the resistor is changed even when the bridge type measuring device is kept at a constant temperature.

This causes a change in the current flowing through an output circuit, thereby causing a change in output voltage.

Namely, the adjustment of the resistors results in shifting the zero point of the output voltage.

To avoid this, the temperature characteristics must be adjusted before the adjustment of the zero point of the output voltage.

Accordingly, there are some restrictions on the adjustment method for each adjustable resistor.

SUMMARY OF THE INVENTION

To solve the problem of the prior art, an object of the present invention is to provide a power source circuit for generating a constant reference voltage at a predetermined temperature, the temperatures characteristics of the output voltage thereof being adjustable.

Another object of the present invention is to provide a bridge type measuring device with an output compensating circuit employing the power source circuit, in which the temperature characteristics of the output of the bridge type measuring device are adjustable without affecting other output characteristics.

Further the object of the present invention is to provide a bridge type measuring device with an output adjusting circuit which can easily be adjusted in assembly steps.

To achieve the objects of the present invention, there is provided a power source circuit for providing a reference constant voltage at a predetermined temperature, the temperature characteristics of the output of the power source circuit being adjustable, and the power source circuit comprising a voltage source for generating an adjustable constant voltage, an amplifying means for amplifying the adjustable constant voltage generated by the voltage source by an amplification factor at the predetermined temperature, the amplification factor being changed in response to a temperature difference between the predetermined temperature and a current temperature, and an output means for providing a reference constant voltage at the predetermined temperature and changing the output voltage thereof in response to a difference between the amplified constant voltage amplified by the amplifying means and the adjustable constant voltage generated by the voltage source.

The present invention also provides a bridge type measuring device with an output compensating circuit which comprises a bridge circuit consisting of a plurality of detecting devices, at least one of the resistance values thereof being varied in response to a variation in conditions of an object to be measured, a constant current source for supplying a constant current to the bridge circuit, an operational amplifier connected to the output of the bridge circuit, the bridge type measuring device being further characterized in that the constant current source includes a circuit for adjusting the sensitivity of the bridge circuit and a sensitivity adjusting circuit for adjusting a sensitivity of said bridge circuit, said sensitivity adjusting circuit comprising a memory for storing a digital value, a digital to analog converter for converting the digital value into an analog value and an amplifier for outputting the constant current determined by the analog value of the analog converter.

The present invention further provides the bridge type measuring device with an output compensating circuit which comprises a bridge circuit consisting of a plurality of detecting devices at least one of the resistance values thereof being varied in response to a variation in conditions of an object to be measured, a constant current source for supplying a constant current to the bridge circuit, an operational amplifier connected to an output of said bridge circuit, and an output circuit, and the bridge type measuring device is further characterized in that it is provided with at least a compensating circuit or an offset adjusting circuit each of which comprising a memory for storing a digital value determining a compensating or adjusting voltage.

According to another aspect of the present invention, there is also provided a bridge type measuring device with an output compensating circuit, which comprises a bridge circuit consisting of a plurality of detecting devices at least one of the resistance values thereof being varied in response to a variation in conditions of an object to be measured and provided with at least one input terminal, a first output terminal and a second output terminal, a constant current source for supplying a constant current to the input terminal of the bridge circuit, an operational amplifier having one input for receiving an output of the first output terminal of the bridge circuit, and another input for receiving an output of the second output terminal of the bridge circuit through a first resistor, a power source circuit for providing a predetermined reference voltage with the temperature characteristics of the output of the power source circuit being adjustable, a second resistor having one end connected to a line connecting the first resistor with the operational amplifier, and another end thereof connected to the power source circuit, and a voltage-to-current converting circuit having one end connected to the line connecting the first resistor with the operational amplifier and generating a current corresponding to an output of the operational amplifier and adjusted by a current flowing through the second resistor.

Operation of the power source circuit will first be explained.

A adjustable constant voltage generated by the voltage source is amplified by the amplifying means by an amplification factor of, for example, 1 at the predetermined temperature. In this case, the amplified constant voltage and the adjustable constant voltage generated by the voltage source have the same magnitude, i.e., the difference between them is zero. At the predetermined temperature, therefore, the voltage provided by the output means is equal to the reference constant voltage.

When a temperature difference relative to the predetermined temperature occurs, the amplification factor of the amplifying means changes. If the adjustable constant voltage generated by the voltage source is changed, the amplification factor of the amplifying means may be constant but the difference between the constant voltage amplified by the amplifying means and the adjustable constant voltage generated by the voltage source may be changed. As a result, the output voltage of the output means is changed. Namely, by adjusting the value of the adjustable constant voltage generated by the voltage source, the required temperature characteristics will be realized in the output voltage.

Operation of the bridge type measuring device with the output compensating circuit employing the above voltage adjusting circuit will be explained next.

The output voltage of the bridge type measuring device will change if the temperature changes. This causes the output current provided by the voltage-to-current converting circuit to change. The temperature characteristics of the power source circuit, that is the constant voltage source are set, however, so that a current flows to the second resistor according to the adjusting voltage of the power source, to compensate the change in the current from the voltage-to-current converting circuit. As described previously, the power source circuit always provides the correct reference voltage, if it is at the predetermined temperature, even when the adjustable constant voltage generated by the voltage source is changed. The temperature characteristics of the output of the bridge type measuring device can be adjusted, therefore, without shifting the zero point of the output voltage of the voltage-to-current converting circuit. Namely, the output characteristics of the bridge type measuring device and voltage-to-current converting circuit can be adjusted independently of each other.

BRIEF DESCRIPTION OF THE DRAWINGS

FIG. 5 is a circuit diagram showing another embodiment of the present invention.

PREFERRED EMBODIMENTS OF THE INVENTION

The preferred embodiments of of the present invention will be explained with reference to the drawings.

Figure 1:
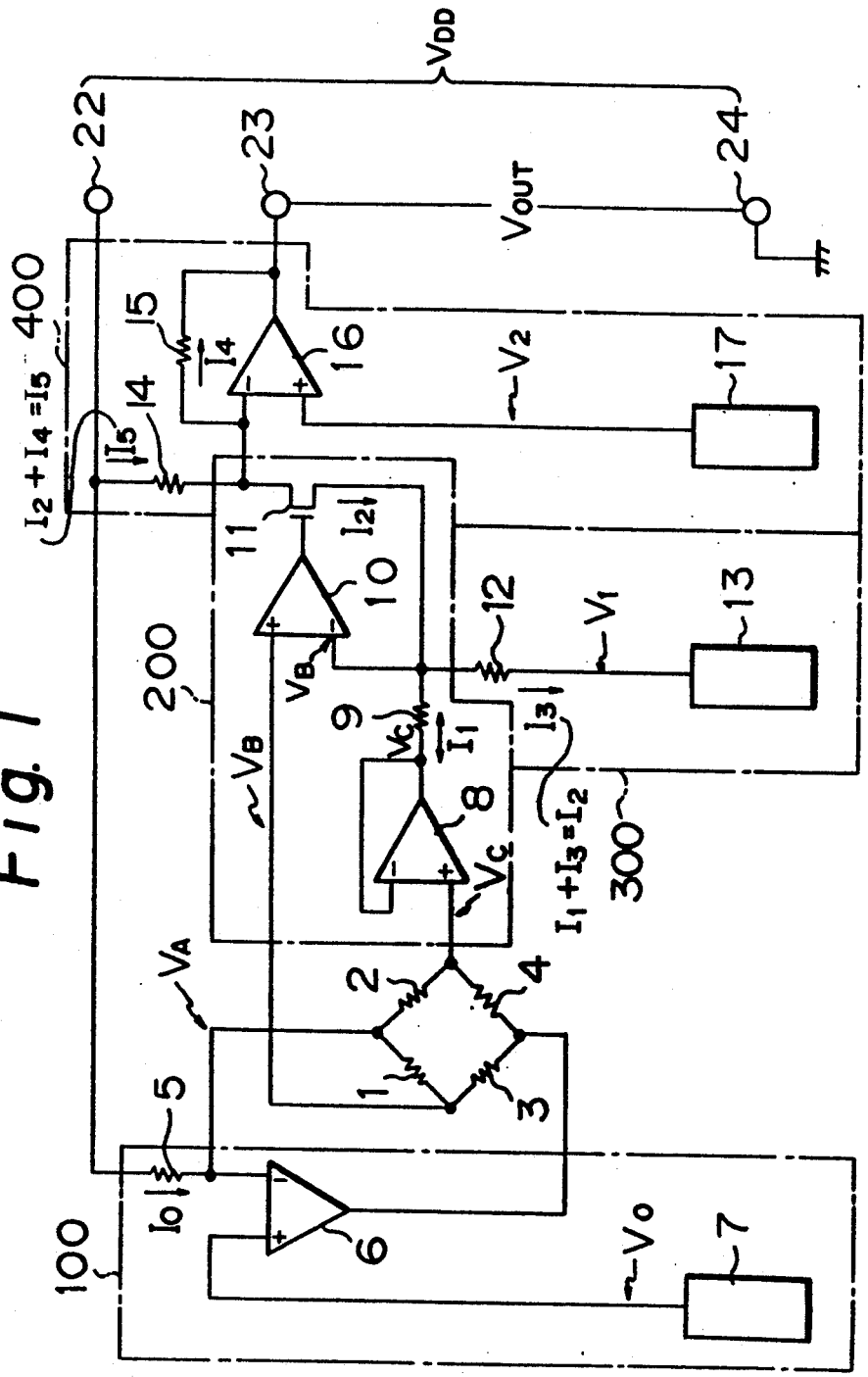
FIG. 1 is a circuit diagram showing an embodiment of the present invention.

FIG. 1 is a circuit diagram showing an output compensating circuit. Numerals 1, 2, 3, and 4 denote detecting elements forming a bridge type measuring device. In this embodiment, the detecting elements are diffused resistors forming a known semiconductor pressure sensor. The structure of the pressure sensor is not shown in the figure. The resistors 1 to 4 are formed by diffusing opposite conductive impurities in a pressure sensitive region of a silicon diaphragm. When the resisters 1 to 4 are deformed by a pressure applied to the diaphragm, resistance values of the resistors 1 to 4 change due to a piezoresistance effect.

The bridge type measuring device (hereinafter referred to as the sensor unit) is not limited to that for measuring pressure, but can also be formed to measure magnetism, light, humidity, etc. For example, to form a magnetism sensor, magnetic resistor elements are employed instead of the diffused resistors 1 to 4 and formed in a bridge circuit, for which the present invention is also applicable. The number of the detecting elements forming the bridge circuit is not limited to four but may be two or so.

Numeral 100 denotes a sensitivity adjusting circuit, i.e., a constant current source comprising a resistor 5, an operational amplifier 6 and a first constant voltage source 7 for outputting a sensitivity adjusting voltage Vo to be described later. The constant current source 100 generates a constant current Io determined by the voltage Vo provided by the first constant voltage source 7 and a resistance value of the resistor 5.

Numeral 200 denotes a voltage-to-current converting circuit comprising operational amplifiers 8 and 10, first resistor 9, and a transistor 11, to convert an output voltage of the bridge circuit into a current corresponding to the output voltage.

Numeral 300 denotes a temperature compensating circuit comprising a second resistor 12, and a second constant voltage source 13 acting as a power source circuit for providing a temperatures adjusting voltage V1 to be described later. The temperature compensating circuit 300 compensates the temperature characteristics of an output voltage Vout.

Numeral 400 denotes a zero point (offset) adjusting circuit for the output voltage Vout, comprising a resistor 14, a third resistor 15, an operational amplifier 16, and a third constant voltage source 17 for providing an offset adjusting voltage V2 to be described later. The zero point adjusting circuit 400 generates the output voltage Vout determined by the offset adjusting voltage V2, set values of the resistors 14 and 15 and an output current of the voltage-to-current converting circuit 200. A constant DC voltage VDD is applied between terminals 22 and 24, and the output voltage Vout proportional to a sensed pressure is generated between terminals 23 and 24.

Operation of the above circuit arrangement will be explained next.

In the bridge circuit, a first output terminal TB provides an output voltage VB and a second output terminal TC provides an output voltage VC. Since the operational amplifier 8 forms an impedance converter, an output thereof is equal to VC. In the operational amplifier 10, a voltage at a negative (−) input terminal is substantially equal to the voltage VB at a positive (+) input terminal because of an imaginal short. These determine currents I1, I3 and I2 flowing through the resistors 9 and 12 and transistor 11 respectively. The power source voltage VDD, output voltage V2 of the third constant voltage source 17 and the resistor 14 determine a current I5 flowing through the resistor 14. The difference of the currents I5 and I2 determines a current I4 flowing through the resistor 15, and the current I4 determines a voltage drop component of the resistor 15.

As a result, the output voltage Vout is changed depending on the output current I2 of the voltage-to-current converting circuit 200.

The above will be explained by using equations.

The resistor 9, 12, 14 and 15 have resistance values R9, R12, R14 and R15, respectively.

$$I1 + I3 = I2$$

$$I1 = \frac{VB - VC}{R9}, I3 = \frac{VB - V1}{R12}$$

Therefore, $$I2 = \frac{VB - VC}{R9} + \frac{VB - V1}{R12} \quad (1)$$

Further, $$I1 + I4 = I5$$

$$I5 = \frac{VDD - V2}{R14} \quad (2)$$

From the equations (1) and (2), $$\begin{aligned} Vout &= V2 - I4 \cdot R15 \\ &= V2 - (I5 - I2) \cdot R15 \\ &= V2 - \frac{R15}{R14}(VDD - V2) + \frac{R15}{R9} \\ &\quad (VB - VC) + \frac{R15}{R12}(VB - V1) \\ &= Voff + Vsens + Vtemp \end{aligned} \quad (3)$$

$$(3)'$$

Here, $$Voff = V2 - \frac{R15}{R14}(VDD - V2)$$

$$Vsens = \frac{R15}{R9}(VB - VC)$$

$$Vtemp = \frac{R15}{R12}(VB - V1)$$

If the output voltage VB of the bridge circuit is equal to the temperature adjusting voltage V1 provided by the second constant voltage source 13, the following is established:

$$\begin{aligned} Vout &= V2 - \frac{R15}{R14}(VDD - V2) + \frac{R15}{R9} \\ &\quad (VB - VC) \\ &= Voff + Vsens \end{aligned} \quad (4)$$

$$(4)'$$

Since the resistance values R9, R12, R14 and R15 and the voltages VDD, V2 and V1 are constant, it is understood from the equations (3) and (4) that the output voltage Vout corresponds to an output voltage (VB-VC) of the bridge circuit, i.e., the sensor unit.

As is apparent from the equation (3)', the output voltage Vout of the output compensating circuit is determined by the voltages Voff, Vsens and Vtemp. Namely, by adjusting the voltages Voff, Vsens and Vtemp, the characteristics of the output voltage Vout can be adjusted as required.

Each of the voltages Voff, Vsens and Vtemp will be explained in detail.

The voltage Vsens will be explained first.

The bridge circuit provides the output voltages VB and VC. A voltage at the positive (+) input terminal of the operational amplifier 6 is VO, and a voltage at the negative (−) terminal thereof is substantially equal to VO due to an imaginal short. The resistor 5 has a resistance value R5, and a current Io flowing through the resistor 5 is expressed as follows:

$$Io = \frac{VDD - Vo}{R5} \quad (5)$$

The resistors 1, 2, 3 and 4 forming the bridge circuit have resistance values R1, R2, R3 and R4, respectively, and the output voltage (VB-VC) of the bridge circuit will be expressed as follows:

$$VB - VC = \frac{R2R3 - R1R4}{R1 + R2 + R3 + R4} \cdot Io \quad (6)$$

If the resistance values R1 to R5 are constant in the equations (5) and (6) and when the output voltage (sensitivity adjusting voltage) VO of the first constant voltage source 7 is changed, the current Io flowing through the resistor 5 is changed according to the equation (5). According to the change of the current Io, it is understood from the equation (6) that the output voltage (VB-VC) of the bridge circuit is changed. Namely, even if a sensed pressure of the bridge type measuring device is not changed, the output voltage (VB-VC) of the bridge circuit changes depending on the output voltage VO of the first constant voltage source 7. It means that the sensitivity of the bridge circuit changes depending on the output voltage VO of the first constant voltage source 7.

Figure 2:
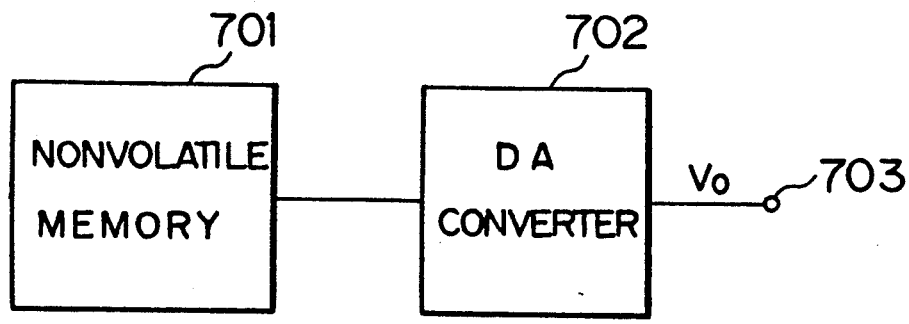
FIG. 2 is a block diagram showing an arrangement of a first constant voltage source of FIG. 1.

As shown in FIG. 2, the first constant voltage source 7 comprises a nonvolatile memory 701 for storing a digital value, and a digital-to analog (DA) converter for converting the digital value stored in the memory 701 into an analog value. Depending on a digital value to be written in the memory 701, the voltage VO to be generated at an output terminal 703 of the first constant voltage source 7 is set optionally. Since the output voltage (VB-VC) of the bridge circuit changes according to the output voltage VO of the first constant voltage source 7 as explained before, the sensitivity of the bridge circuit can be adjusted by a digital value to be written in the memory 701.

In this way, the voltage Vsens [=(R15/R9)(VB−VC)] is a term that can adjust the sensitivity of the bridge circuit.

Next the voltage Vtemp will explained.

The voltage Vtemp is determined by the difference of the output voltage VB of the bridge circuit and the output voltage (temperature adjusting voltage) V1 of the second constant voltage source 13.

Figure 3:
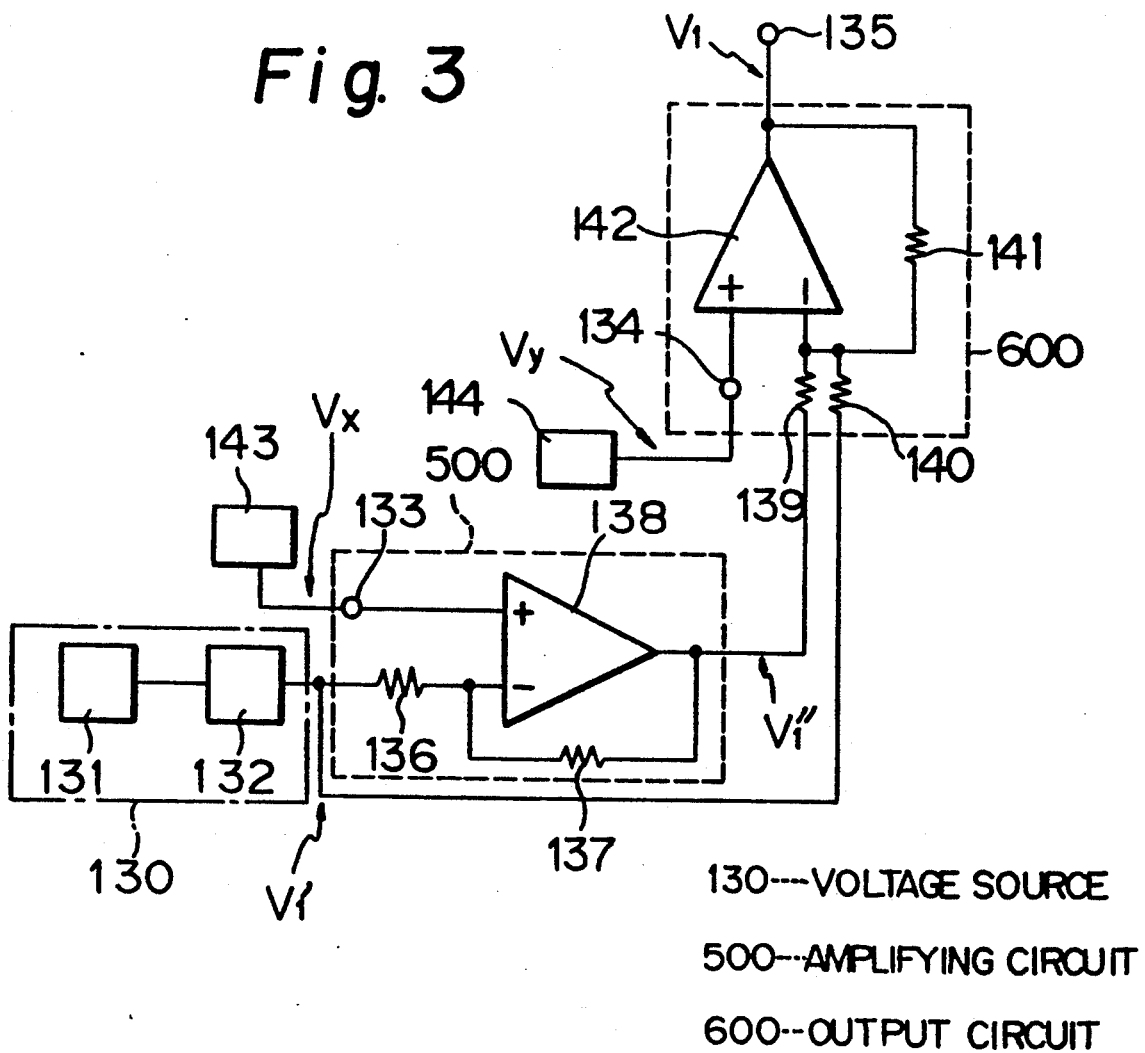
FIG. 3 is a circuit diagram showing an arrangement of a second constant voltage source of FIG. 1.

FIG. 3 shows an arrangement of the second constant voltage source 13. In the figure, numeral 131 denotes a nonvolatile memory for storing a digital value, and 132 a DA converter for converting the digital value stored in the nonvolatile memory 131 into an analog value. The memory 131 and DA converter 132 form a voltage source 130. Numerals 143 and 144 are voltage adjusting circuits, respectively, each for providing an analog voltage.

Numeral 500 denotes an amplifying circuit comprising resistors 136 and 137 and an operational amplifier 138, to invert and amplify an output voltage (adjustable constant voltage) V1' of the DA converter 132.

Numeral 600 denotes an output circuit comprising resistors 139, 140 and 141 and an operational amplifier 142, to add the output voltage V1' of the DA converter 132 to an output voltage V1" inverted and amplified by the amplifying circuit 500. A result of the addition is provided from an output terminal 135.

Operation of the second constant voltage source 13 will be explained next.

A digital value is written in the memory 131, and the DA converter 132 provides an analog output voltage V1' corresponding to the digital value. The resistors 136 and 137 have resistance values R136 and R137, respectively. A voltage Vx of the voltage adjusting circuit 143 is applied to a positive (+) input terminal 133 of the operational amplifier 138. The output voltage (amplified constant voltage) V1" of the amplifying circuit 500 is expressed as follows:

$$V1'' = Vx - \frac{R137}{R136}(V1' - Vx)$$

Namely, the output voltage V1" is based on the voltage Vx and derived by inverting and amplifying the output voltage V1' of the DA converter 132. The output voltage V1" of the inverting and amplifying circuit 500 and the output voltage V1' of the DA converter 132 are applied to the output circuit 600. The resistors 139, 140 and 141 have resistance values R139, R140 and R141, respectively. A voltage Vy from the voltage adjusting circuit 144 is applied to a positive (+) input terminal 134 of the operational amplifier 142. The output voltage (reference constant voltage) V1 of the output circuit 600 is expressed as follows:

$$V1 = \left[1 + \frac{R141}{R139} + \frac{R141}{R140}\right]Vy - \frac{R141}{R139}\left[1 + \frac{R137}{R136}\right]Vx + \left[\frac{R141}{R139} \cdot \frac{R137}{R136} - \frac{R141}{R140}\right]V1' \quad (7)$$

The resistance value R137 of the resistor 137 at a predetermined temperature (for example, a room temperature) is set to be equal to the resistance value R136 of the resistor 136, and the resistors 136 and 137 are made of materials having different resistance temperature factors. The resistance value R137 of the resistor 137 is expressed as follows:

$$R137 = R136(1 + \alpha T)$$

where a is the resistance temperature factor of the resistor R137, and T is a temperature difference relative to the predetermined temperature.

If the resistance values and resistance temperature factors of the resistors 139, 140 and 141 are equal to each other, the output voltage V1 of the output circuit 600 will be as follows:

$$V1 = 3Vy - (2 + \alpha T)Vx + \alpha T V1' \quad (8)$$
$$= 3Vy - 2Vx + (V1' - Vx)\alpha T$$

With the voltage V0 at the positive (+) input terminal of the operational amplifier 6 and the current I0 flowing through the resistor R5 in FIG. 1, the voltage VB at the positive (+) input terminal of the operational amplifier 10 will be as follows:

$$VB = Vo - \frac{R1(R2 + R4) Io}{R1 + R2 + R3 + R4}$$

If the resistance value of each of the resistors 1 to 4 of the bridge circuit is Rs, the voltage VB is:

$$VB = Vo - \frac{1}{2} Rs Io \quad (9)$$

By combining the equations (9) and (5), the following is established:

$$\begin{aligned} VB &= Vo - \frac{1}{2} Rs \left[\frac{VDD - Vo}{R5}\right] \\ &= \left[1 + \frac{1}{2} \cdot \frac{Rs}{R5}\right]Vo - \frac{1}{2} \frac{Rs}{R5} VDD \end{aligned} \quad (10)$$

If the voltages Vy and Vx are set to satisfy the following:

$$Vy = \frac{1}{3}\left[1 + \frac{1}{2} \frac{Rs}{R5}\right]Vo,$$

$$Vx = \frac{1}{4} \cdot \frac{Rs}{R5} VDD$$

the following will be established according to the equations (8) and (10):

$$V1 = VB + \left[V1' - \frac{1}{4} \frac{Rs}{R5} VDD\right]\alpha T \quad (11)$$

Namely, by setting the voltages Vx and Vy to satisfy the above conditions, the voltage VB at the positive (+) input terminal of the operational amplifier 10 and the voltage V1 provided by the second constant voltage source 13 become equal to each other at the predetermined temperature. In this case, the voltage Vtemp is zero, so that an offset caused by the voltage Vtemp on the output voltage Vout of the output compensating circuit will be zero. Accordingly, the offset of the output voltage Vout can be simply adjusted.

The equation (11) indicates that the voltage V1 is equal to the reference voltage VB at the predetermined temperature and changes at the following ratio in response to a temperature change:

$$\left[V1' = \frac{1}{4} \frac{Rs}{R5} VDD\right]\alpha$$

If a positive temperature change, for instance from 25 centigrade to 80 centigrade, occurs at an optional pressure P1, the current I4 may be reduced to cause the output voltage Vout to increase by DVout. To prevent (compensate) the reduction of the current I4, the output current I2 of the voltage-to-current converting circuit 200 shall be reduced, because the current I5 flowing through the resistor 14 is constant. When the resistors 1 to 4 of the sensor unit have positive temperature characteristics and when the voltage VB is decreased by DVB due to the above temperature increase, the current I3 flowing through the resistor 12 is decreased, because the same voltage VB appears at the negative (−) input terminal of the operational amplifier 10 due to an imaginal short. This decrease of the current I3 causes the current I2 to decrease ($I2 = I1 + I3$). To secure that the reduction of the current I2 surely prevents the current I4 from decreasing, the voltage V1 shall be adjusted to satisfy the following:

$$\Delta Vout = \frac{R15}{R12} (\Delta VB - \Delta V1)$$

With this, the temperature characteristics of the output voltage Vout is surely compensated.

When the resistors 1 to 4 of the sensor unit have positive temperature characteristics to increase the voltage VB by DVB in response to a temperature increase, or when the resistors 1 to 4 of the sensor unit have negative temperature characteristics, the same adjustment as above is applicable to compensate the temperature characteristics of the output voltage Vout.

Now the voltage Voff will be explained.

As apparent from the equations (3) and (4), the voltage Voff can adjust an offset of the output voltage Vout, and the voltage Voff can be adjusted by the voltage (offset adjusting voltage) V2 provided by the third constant voltage source 17. Similar to the first constant voltage source 7, the third constant voltage source 17 comprises a memory for storing a digital value, and a DA converter for converting the digital value stored in the memory into an analog value. The offset of the output voltage Vout can easily be adjusted, therefore, by adjusting the digital value to be stored in the memory.

If the memories in the first, second and third constant voltage sources 7, 13 and 17 are formed of RAMs, the output characteristics of the bridge type measuring device may optionally be adjusted.

In the second constant voltage source 13 of the above embodiment, an output voltage V1′ provided by the voltage source 130 (FIG. 3) comprising the memory 131 and DA converter 132 is inverted and amplified by the amplifying circuit 500. The output voltage V1′ from the voltage source 130 may not be inverted but amplified by an amplification factor that changes according to a temperature change. In this case, the difference of the amplified output voltage V1″ and the output voltage V1′ from the voltage source 130 is detected to change an output voltage V1 provided by the output circuit 600.

In the above embodiment, the resistance values of the resistors R136 and R137 are the same as each other at a predetermined temperature. The resistance values of the resistors R136 and R137 may be set such that one is k times the other and $R139 = kR140$ at the predetermined temperature. Then, as apparent form the equation (7), an output voltage V1 (temperature adjusting voltage) of the output circuit 600 will be determined by multiplying the temperature factor α of the resistor R137 by a value determined by a ratio of the resistors R140 and R141, irrespective of the value of the output voltage V1′ of the voltage source 130.

As explained before, the second constant voltage source 13 outputs a predetermined reference voltage V1 (temperature adjusting voltage) at a predetermined temperature, and the temperature characteristics of an output voltage V1 thereof are optionally adjustable. If the second constant voltage source 13 is employed as a power source circuit of a CR oscillation circuit, the temperature characteristics of an oscillation frequency of the CR oscillation circuit can surely be compensated.

Such a CR oscillation circuit employing the second constant voltage source 13 as a power source circuit thereof will be explained.

Figure 4:
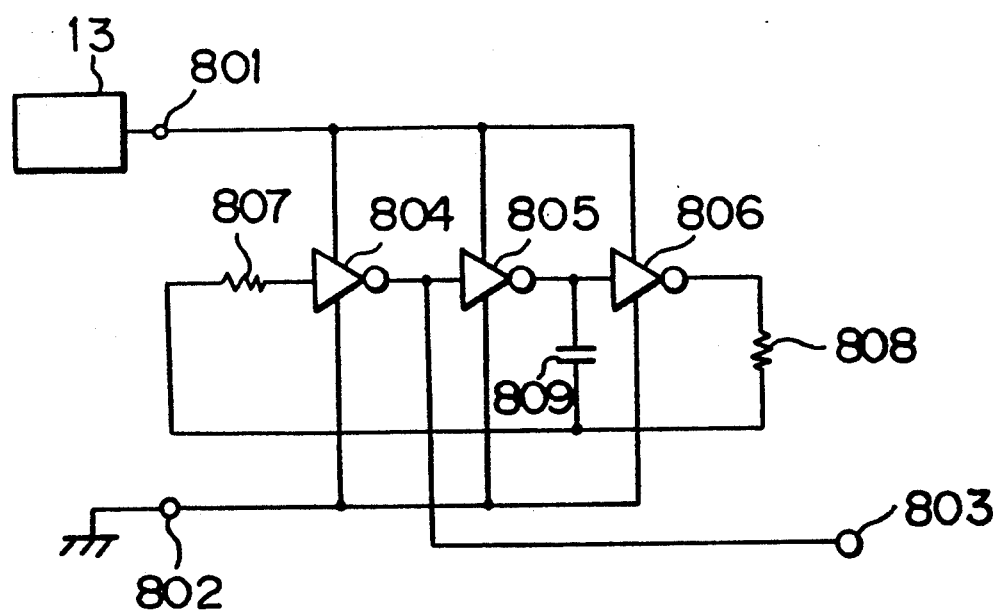
FIG. 4 is a circuit diagram showing a CR oscillation circuit adopting the second constant voltage source as a power source circuit of FIG. 1.

FIG. 4 shows a known CR oscillation circuit comprising inverters 804, 805 and 806, resistors 807 and 808, and a capacitor 809. Time constants of the resistor 808 and capacitor 809 determine an oscillation frequency. Numeral 801 denotes a power source terminal connected to the second constant voltage source 13, 802 a grounding terminal, and 803 an output terminal In this sort of CR oscillation circuit, it is well known that the switching time of transistors forming the inverters 804, 805 and 806 and the temperature characteristics of the resistor 104, capacitor 105, etc, affect the oscillation frequency.

Here, it is supposed the time constants of the resistor 808 and capacitor 809 are adjusted to obtain an output oscillation frequency f1. If a predetermined temperature T1 is changed by DT to T1+DT, the oscillation frequency f1 will be changed by Df1 to f1+Df1. The oscillation frequency of the Cr oscillation circuit is also affected by a power source voltage To cope with this, an output voltage of the second constant voltage source 13 connected to the terminal 801 may be changed from V1 to V1+DV1 to keep the oscillation frequency of the CR oscillation circuit constant The output voltage V1 of the second constant voltage source 13 is fixed at the predetermined temperature, irrespective of a digital value to be written in the memory of the second constant voltage source 13, so that the oscillation frequency may be stationary. By employing the second constant voltage source 13 as a power source circuit of the Cr oscillation circuit, therefore, the oscillation frequency may be set only by the time constants of the resistor 808 and capacitor 809, and the temperature characteristics of the oscillation frequency may surely be compensated.

When the oscillation frequency changes from f1 to f1-Df1 due to a temperature increase, the digital value to be written in the memory of the second constant voltage source 13 may be set to bring the output voltage thereof from V1 to V1-DV1.

Another embodiment of the present invention will be explained next with reference to FIG. 5.

FIG. 5 shows a block diagram of another bridge type measuring device according to the present invention. Most of the circuits used in this embodiment are the same as those used in the previous embodiment shown in FIGS. 1 and 3. The same components as used in FIGS. 1 and 3 are labeled with the same references numerals as used in FIGS. 1 and 3.

In this embodied, the only difference is in the second constant voltage source 13 in which only one voltage adjusting circuit 145 is provided instead of two voltage adjusting circuits 143 and 144 as used in the circuit of FIG. 3.

In this embodiment, the same voltage output from the voltage adjusting circuit 145 is applied to both of the non-inverting inputs of the operational amplifiers 138 and 142.

In this case, when Vx=Vy is assumed, the output voltage V1 represented in equation (8) is rewritten as follows;

$$V1 = Vx + (V1' - Vx)\alpha T \tag{12}$$

and therefore the current I3 flowing through the resistor R12 is constant as long as the temperature is kept constant, whereby adjustment of the offset caused by the voltage Vtemp can be easily carried out.

In the previous embodiment (FIG. 1–FIG. 3), in order to make an offset caused by the voltage Vtemp zero, the voltages Vx and Vy are adjusted so that V1=VB at a predetermined temperature is created.

In this embodiment (FIG. 5), the offset adjustment is different from that of the previous embodiment in that only one voltage adjusting circuit 145 is provided and the constant offset voltage (VB−Vx) is generated at a predetermined temperature.

Note that the voltage adjustment of this embodiment, however, has an advantage in that the circuit construction can be simplified due to the voltage adjustment operation being carried out in only one step.

Also in this embodiment, the offset voltage at a predetermined temperature is kept at constant regardless of the voltage V1', thus making the adjusting operation easy, and making it possible to adjust the offset completely independent of other adjusting operations for other factors.

As explained above, the present invention provides a power source circuit that provides a reference voltage at a predetermined temperature, the temperature characteristics of the output voltage of the power source circuit being adjustable. If the power source circuit is employed as an output compensating circuit for a bridge type measuring device, the temperature characteristics of the output of the bridge type measuring device may be adjusted without affecting other output characteristics.

Also, in the present invention, the adjusting operation can be carried out, for example, by first adjusting the voltage of the first constant voltage source 7 (FIG. 1) to adjust the current input to the bridge circuit, and thereafter adjusting the voltage output from the third constant voltage source 17.

In this case, if the voltage adjustment of the first constant voltage source 7 is not correct, another voltage adjustment of the third constant voltage source 17 should be repeated.

However, in the present invention, this adjustment can be carried out smoothly since a digital type voltage generating means is used in the constant voltage source. Moreover, each of the temperature characteristics of the bridge circuits is naturally different from each other because it is usually difficult to control a producing step thereof constant to give the same characteristic thereto.

Therefore, it is necessary for the temperature characteristics of the bridge circuit to be adjusted to a predetermined value utilizing the temperature compensating circuit 13 (FIG. 1) and in this instant, it is adjusted utilizing voltage having a certain temperature characteristic.

According to the present invention, this adjusting operation can be carried out smoothly since the voltage used for this adjustment can be easily increased or decreased in accordance with the digital value.

We claim:

1. A power source circuit for providing a reference constant voltage having given temperature characteristics at a predetermined temperature, the temperature characteristics of said reference constant voltage of the power source circuit being adjustable, comprising:

a voltage source for generating an adjustable constant voltage;

amplifying means for amplifying the adjustable constant voltage generated by the voltage source by an amplification factor at the predetermined temperature, the amplification factor being changed in response to a temperature difference between said predetermined temperature and a current temperature, said amplifying means outputting an amplified constant voltage at a predetermined temperature; and output means for providing the reference constant voltage at the predetermined temperature and changing the reference constant voltage thereof in response to a difference between the amplified constant voltage output from said amplifying means and the adjustable constant voltage generated by the voltage source.

2. A bridge type measuring device with an output compensating circuit, comprising:

a bridge circuit comprising a plurality of detecting devices, at least one of resistance values thereof being varied in response to a variation in conditions of an object to be measured and provided with at least an output terminal, a first output terminal and a second output terminal;

a first constant current source for supplying a constant current to the input terminal of the bridge circuit;

an operational amplifier having one input for receiving an output of the first output terminal of said bridge circuit, and another input for receiving an output of said second output terminal thereof through a first resistor, said operational amplifier and said first resistor forming a voltage-to-current converting circuit;

a constant voltage source for providing a temperature adjusting voltage and the temperature characteristics of the temperature adjusting voltage being adjustable, a second resistor having one end connected to a line connecting said first resistor with said operational amplifier, and another end thereof connected to said constant voltage source; and said voltage-to-current converting circuit further comprising an output portion connected to a portion formed on a line connecting said first resistor with said operational amplifier and a second constant voltage source, and generating an output current from said output portion corresponding to an output of said operational amplifier and said output current being adjusted by a current flowing through said second resistor to said constant voltage source.

3. A bridge type measuring device with an output compensating circuit according to claim 2, wherein said constant voltage source comprises;

a voltage source for generating an adjustable constant voltage;

amplifying means for amplifying the adjustable constant voltage generated by the voltage source by an amplification factor at the predetermined temperature and providing an amplified constant voltage, and the amplification factor being changed in response to a temperature difference between said predetermined temperature and a current temperature; and output means for providing the temperature adjusting voltage at the predetermined temperature and changing the temperature adjusting voltage thereof in response to an total value obtained by summing up the amplified constant voltage amplified by the amplifying means and the adjustable constant voltage generated by the voltage source.

4. A bridge type measuring device, with an output compensating circuit according to claim 2, wherein said bridge type measuring device further comprises an offset adjusting circuit connected to said output portion of said voltage-to-current converting circuit and said offset adjusting circuit comprising:
- a constant voltage source for generating an offset adjusting voltage, and
- an operation amplifier having one input for receiving the offset adjusting voltage of said constant voltage source and another input for receiving an output signal of said output portion of said voltage-to-current converting circuit, and said output signal of the voltage-to-current converting circuit being also connected to an output of the operational amplifier through a third resistor, wherein, said offset adjusting circuit generates an output voltage corresponding to the output current provided by said voltage-to-current converting circuit and said offset adjusting voltage generated by said constant voltage source being adjusted to adjust an offset voltage of said output voltage of the offset adjusting circuit.

5. A bridge type measuring device with an output compensating circuit according to claim 2, wherein said constant voltage source comprises;
- a voltage source,
- an amplifying circuit for amplifying a voltage output from said voltage source and for providing an amplified voltage and
- an output circuit providing for the temperature adjusting by amplifying an input voltage constituted by adding said voltage output from said amplifying circuit.

6. A bridge type measuring device with an output compensating circuit according to claim 5, wherein at least one voltage adjusting circuit is provided and said voltage adjusting circuit outputs analog voltage utilizing said amplifying circuit and said output circuit.

7. An output compensating circuit of a bridge type measuring device, which comprises;
- a bridge circuit consisting of a plurality of detecting devices, at least one of resistance values thereof being varied in response to a variation in conditions of an object to be measured and providing an output voltage in response to the resistance value,
- a first constant voltage source for generating a first constant voltage corresponding to a digital value stored in a first memory means,
- a current supplying means for supplying an input current to said bridge circuit utilizing said first constant voltage generated by said constant voltage source,
- a amplifying circuit for amplifying said output voltage output from said bridge circuit to provide an output signal, and
- a second constant voltage source for adjusting said output signal provided from said amplifying circuit by supplying a temperature adjusting voltage to said amplifying circuit and generating the temperature adjusting voltage corresponding to a digital value stored in a second memory means provided in said second constant voltage source.

8. An output compensating circuit of a bridge type measuring device, which comprises;
- a bridge circuit comprising a plurality of detecting devices, at least one of resistance values thereof being varied in response to a variation in conditions of an object to be measured,
- a current supplying means for supplying an input current to said bridge circuit,
- a voltage-to-current converting circuit for generating a current signal in response to a voltage output from said bridge circuit,
- a memory means for storing a digital value therein,
- a voltage generating means for generating a compensated voltage corresponding to a digital value stored in said memory means,
- a temperature compensating means for compensating a voltage generated from said voltage generating means in accordance with a temperature variation so that the variation of said current signal output from said voltage-to-current converting circuit in accordance with a variation of the output voltage of said bridge circuit due to a temperature variation of said bridge circuit is compensated, and for varying said current signal to increase or decrease thereof utilizing said compensated voltage,
- an output circuit for generating an output voltage signal in accordance with said current signal.

* * * * *